United States Patent [19]

Koto et al.

[11] Patent Number: 4,652,465
[45] Date of Patent: Mar. 24, 1987

[54] PROCESS FOR THE PRODUCTION OF A SILVER COATED COPPER POWDER AND CONDUCTIVE COATING COMPOSITION

[75] Inventors: Noriaki Koto; Joei Yukawa; Takeo Moro, all of Ichihara, Japan

[73] Assignee: Nissan Chemical Industries Ltd., Tokyo, Japan

[21] Appl. No.: 731,402

[22] Filed: May 7, 1985

[30] Foreign Application Priority Data

May 14, 1984 [JP] Japan .................................. 59-96144
Jan. 16, 1985 [JP] Japan .................................. 60-5591

[51] Int. Cl.$^4$ ......................... B05D 7/00; B22F 7/00; H01B 1/02
[52] U.S. Cl. .................................. 427/216; 106/1.18; 252/514; 427/217; 428/403
[58] Field of Search ................. 427/216, 217; 428/403; 106/1.18; 252/514

[56] References Cited

U.S. PATENT DOCUMENTS 2,771,380 11/1956 Coleman et al. ............... 427/216 X

FOREIGN PATENT DOCUMENTS 824091 11/1959 United Kingdom ................ 427/216
978606 12/1964 United Kingdom ................ 427/216

Primary Examiner—Michael R. Lusignan
Attorney, Agent, or Firm—Oblon, Fisher, Spivak, McClelland & Maier

[57] ABSTRACT

A process for producing a silver coated copper powder, characterized in that a metal silver is precipitated on the surface of a metal copper powder by means of a silver complex solution comprising a silver salt, an ammonium carbonate compound and ammonia water as essential components.

4 Claims, 2 Drawing Figures

PROCESS FOR THE PRODUCTION OF A SILVER COATED COPPER POWDER AND CONDUCTIVE COATING COMPOSITION

The present invention relates to a process for producing a silver coated copper powder. More particularly, the present invention relates to a process for economically producing a silver coated copper powder having excellent conductivity and oxidation resistance. Further, the present invention relates to a conductive coating composition containing the silver coated copper powder having excellent conductivity and oxidation resistance.

A conductive coating composition containing a metal powder as a conductive filler is practically used as a coating composition for shielding electromagnetic waves, which is coated on casings for electronic equipments for the purpose of shielding electromagnetic waves generated from the electronic equipments, as a conductive paste for electrically connecting an element such as a resistor on a printed circuit board with a circuit, and as a conductive adhesive for connecting various electronic parts on a printed circuit board or bonding a portion which requires conductivity, such as bonding to a lead out terminal.

As the metal powder as conductive filler for the conductive coating composition, there has been used gold, silver, copper, nickel, palladium, etc. Noble metals such as gold and silver have excellent conductivity and oxidation resistance. However, they are expensive and economically disadvantageous. On the other hand, copper is inexpensive, and its initial conductivity is good. However, it is inferior in the oxidation resistance and fails to maintain high conductivity for a long period of time.

There have been various attempts to coat silver on the surface of a copper powder to overcome the drawback of the copper powder and to produce a conductive filler which is inexpensive and yet has excellent conductivity and durability.

For instance, Japanese Examined Patent Publication No. 3019/1972 discloses a method for precipitating silver on the copper surface by means of silver cyanide. In this method, a highly toxic alkali metal cyanide is employed in a high concentration, and there have been various problems in respect of e.g. the working environment.

Further, there has been proposed a method in which silver is precipitated on a copper powder by plating method by means of silver nitrate, ammonia water and sodium thiosulfate, or a method in which silver is precipitated on a copper powder by using glucose as a reducing agent. However, the conductivity of the silver coated copper powders prepared by these methods are not adequately high.

Furthermore, Japanese Examined Patent Publication No. 59283/1982 discloses a method wherein silver nitrate, ammonium carbonate and trisodium ethylenediamine tetraacetate are used. The silver coated copper powder prepared by this method has good conductivity. However, its humidity resistance is not adequate, and thus the oxidative stability as time passes, is not adequate.

The present inventors have conducted extensive researches to solve the above problems, and have found a fact that a silver complex solution comprising a silver salt, an ammonium carbonate compound and ammonia water as essential components, exhibits no substantial toxicity in the working environment of its handling and gives an inexpensive silver coated copper powder having excellent conductivity, heat resistance, humidity resistance and extremely high oxidation stability even with a very small amount of the silver coating. The present invention has been accomplished on the basis of this discovery.

Namely, the present invention provides a process for producing a silver coated copper powder, characterized in that a metal silver is precipitated on the surface of a metal copper powder by means of a silver complex solution comprising a silver salt, an ammonium carbonate compound and ammonia water as essential components.

Further, it has been found that a conductive coating composition containing a silver coated copper powder produced by this process, has excellent properties.

On this basis, the present invention provides a conductive coating composition comprising from 1 to 6 parts by weight of a silver coated copper powder obtained by precipitating a metal silver on the surface of a metal copper powder by means of a silver complex solution comprising a silver salt, an ammonium carbonate compound and ammonia water as essential components and 1 part by weight of a binder.

Now, the present invention will be described in detail with reference to the preferred embodiments.

In the accompanying drawings.

Figure 1:
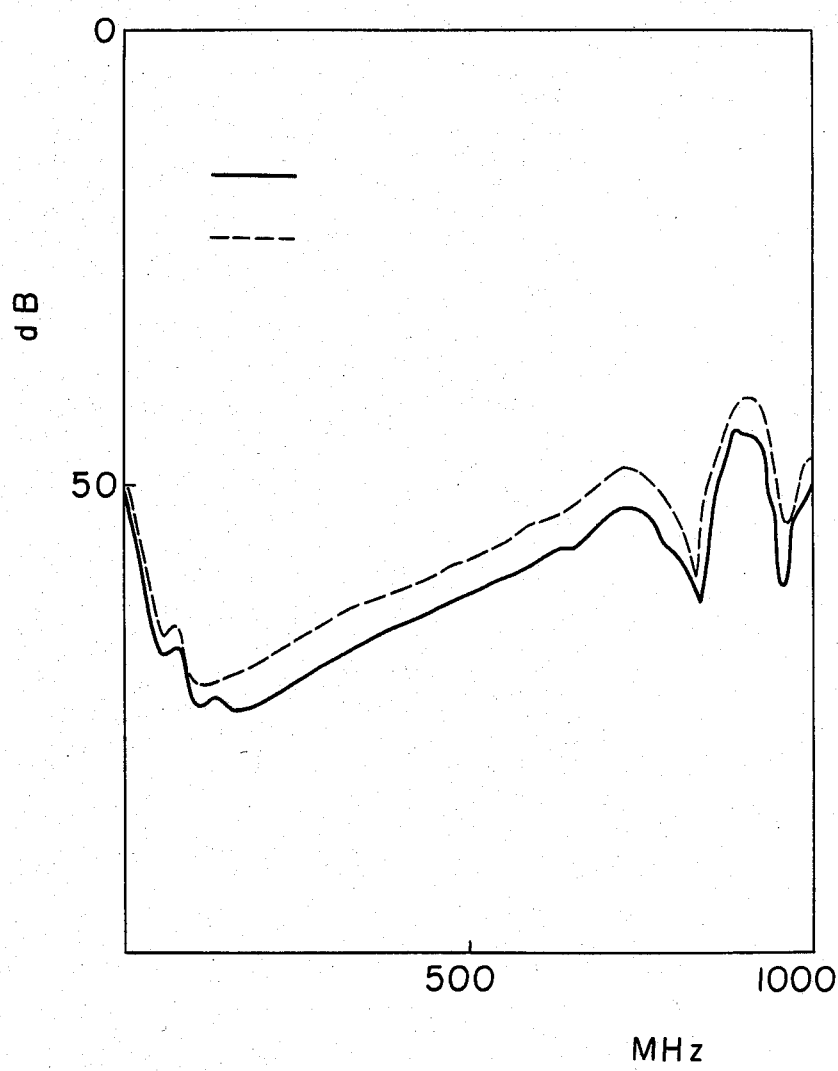
FIG. 1 illustrates the electric field shielding effectiveness of the coating layer obtained in Example 5.

In the present invention, the silver salt is at least one salt selected from the group consisting of silver nitrate, silver carbonate, silver sulfate and silver oxide. The ammonium carbonate compound is at least one compound selected from the group consisting of ammonium carbonate and ammonium bicarbonate. The commercial ammonia water having a concentration of from 25 to 30 w/v % is employed. However, the ammonia water is not restricted to such a concentration.

The molar ratio of the ammonium carbonate compound to ammonia in the ammonia water is preferably from 0.1 to 3, more preferably from 0.2 to 2, when ammonium carbonate is used as the ammonium carbonate compound. The molar ratio is preferably from 0.1 to 6, more preferably from 0.2 to 4, in the case where ammonium bicarbonate is used as the ammonium carbonate compound.

If silver is coated on the surface of the copper powder with a composition where the molar ratio of the ammonium carbonate compound to ammonia in the ammonia water is outside the above-mentioned range, and the resulting silver coated copper powder is used for coating, the conductivity of the coating thus formed tends to be poor. Therefore, the molar ratio of the ammonium carbonate compound to ammonia in the ammonia water should preferably be within the above-mentioned range.

As the process of the present invention for coating a copper powder with silver, there may be mentioned a method wherein the copper powder is suspended in water, and a silver complex solution is dropwise added thereto, a method wherein the copper powder is suspended in ammonia water, and a silver complex solution is dropwise added thereto, and a method wherein the copper powder is suspended in an aqueous solution of an ammonium carbonate compound, and the silver complex solution is dropwise added thereto. Any one of such methods may be employed. However, the silver salt is used preferably in the form uniformly dissolved in an ammonium solution.

The solubility of the silver salt in an ammonium solution varies depending upon the type of the silver salt. When the amount of the silver salt is small relative to the amounts of the ammonium carbonate compound and the ammonia water, a uniform solution can readily be formed. However, as the amount of the silver salt increases, the silver salt tends to be hardly soluble in the ammonium solution.

Therefore, the ammonium carbonate compound and the ammonia water are preferably used in excess amounts relative to the silver salt.

The copper powder may be any one of electrolytic copper powder, atomized copper powder, reduced copper powder, stamped copper powder, etc. The shape of the copper powder may be spherical, flake, dendrite or needle. Further, there is no particular restriction as to the size of copper powder.

There is no particular restriction with respect to the ratio of copper to silver in the silver coated copper powder. However, the product becomes expensive as the amount of the silver coating increases.

Further, the present invention provides a conductive coating composition which comprises from 1 to 6 parts by weight of a silver coated copper powder obtained in the above-mentioned manner and 1 part by weight of binder.

As the binder, there may be employed a methyl methacrylate resin, a urethane resin, a polyvinyl chloride, an epoxy resin, a phenol resin, a xylene resin, an alkyd resin and a polyester. In addition to such a resin binder, an organic solvent is usually used. As such an organic solvent, there may be employed an aromatic compound, an ester, a ketone, an alcohol or a mixture thereof.

The binder resin and organic solvent are suitably selected for a particular application such as for the shielding of electromagnetic waves, for a conductive paste or for a conductive adhesive.

Further, if required, an anti-settling additives such as an oxidized polyethylene, a polyamide resin and fine particle silica may be incorporated.

For instance, a coating composition for shielding electromagnetic waves may be prepared by thoroughly kneading and dispersing the silver coated copper powder, a binder such as a methyl methacrylate, a solvent mixture such as toluene, xylene, methyl ethyl ketone and butyl cellosolve, and an anti-settling additive such as fine particle silica, by means of dissolver.

With respect to the proportions of the silver coated copper powder and binder, the weight ratio of the silver coated copper powder to the binder is preferably within a range of from 1 to 6. If the ratio exceeds this range, the resulting coating layer tends to be brittle. On the other hand, if the ratio is smaller than this range, the conductivity of the coating layer tends to deteriorate.

The anti-settling additive is incorporated preferably in an amount within a range of from 0.5 to 5% by weight relative to the silver coated copper powder. If the amount is less than 0.5% by weight, no adequate antisettling effect will be obtained. On the other hand, even if the amount exceeds 5% by weight, no substantial increase in the anti-settling effect is expected.

Further, the total amount of the silver coated copper powder, the binder and the anti-settling additive in the conductive coating composition is preferably within a range of from 20 to 80% by weight.

The silver coated copper powder produced by the present invention has a silver coating amount of as small as about 1% by weight, and yet provides a coating layer having excellent conductivity and superior durability. Thus, the industrial value of the silver coated copper powder is significant.

Now, the present invention will be described in further detail with reference to Examples and Comparative Examples. However, it should be understood that the present invention is by no means restricted to these specific Examples.

EXAMPLE 1

60 g of a copper powder (CE1110, manufactured by Fukuda Kinzokuhaku) was subjected to degreasing treatment with an alkaline aqueous solution, oxide layer-removing treatment with diluted sulfuric acid and washing with water until the PH of the washing water became 7, and 150 ml of distilled water (hereinafter referred to simply as "water") was added. While stirring the mixture at 400 rpm, a silver complex solution having the following composition was dropwise added at room temperature over a period of 5 minutes, and the stirring was continued for further 1 hour to obtain a silver coated copper powder.

| Composition of a silver complex solution | |
| --- | --- |
| Silver nitrate | 12.5 g |
| Ammonium carbonate | 20.0 g |
| Ammonia water (concentration: 29 w/v %) | 20.0 g |
| Water | 100 ml |

The silver coated copper powder was washed with water until the pH of the washing water became 7, and then vacuum-dried at 50° C. The final amount of the silver coated copper powder was 63.5 g, and the silver content was 12.5% by weight.

By means of a homogenizer, 30 g of this silver coated copper powder and 75 g of a polymethyl methacrylate solution having the following composition were mixed at 3000 rpm for 30 minutes to obtain a paint. This paint was applied onto an ABS resin plate having a size of 15×15 cm and a thickness of 3 mm to form a coating layer having a thickness of 50 μm.

| Composition (weight %) of a polymethyl methacrylate solution | |
| --- | --- |
| Polymethyl methacrylate | 10% |
| Toluene | 40% |
| Methyl ethyl ketone | 18.8% |
| Butyl acetate | 31.2% |

The surface resistivity of the coating layer thus obtained having a thickness of 50μm was 0.05 Ω/□, and thus the coating layer exhibited good electric conductivity.

Further, in order to examine the durability of this coating layer, the sample was left to stand in a constant temperature and humidity chamber at 70° C. under a relative humidity of 93% for 20 days, and then the surface resistivity of the coating layer was measured, whereby no change was observed.

Furthermore, no change was observed in the surface resistivity after the sample was left to stand at 85° C. for 20 days in a constant temperature bath, and thus the coating layer exhibited excellent durability.

EXAMPLES 2 to 11

To 40 g of a copper powder treated in the same manner as in Example 1, 100 ml of water was added. While stirring the mixture at 400 rpm, a silver complex solution prepared by dissolving a silver salt, an ammonium carbonate compound and ammonia water (concentration: 29 w/v %) in 100 ml of water, as identified in Tables 1 and 2, was dropwise added at room temperature over a period of 5 minutes, and the stirring was continued for further 1 hour to obtain a silver coated copper powder in the same manner as in Example 1.

In the same manner as in Example 1, a paint was prepared from the silver coated copper powder thus obtained, and the surface resistivity and durability of the coating layer was measured. The results are shown in Tables 1 and 2.

Further, by means of a spectrum analyzer (manufactured by Takeda Riken), the coating layer obtained in Example 5 was tested for the electric field and magnetic field shielding effectiveness at a frequency of from 10 to 1000 MHz. The results are shown in FIGS. 1 and 2.

FIG. 1 illustrates the electric field shielding effectiveness, in which the ordinate axis represents the attenuation (dB), the abscissa represents the frequency (MHz), the solid line indicates the initial values, and the dotted line indicates the values after the sample was left to stand in a constant temperature and humidity chamber at 70° C. under a relative humidity of 93% for 20 days.

Figure 2:
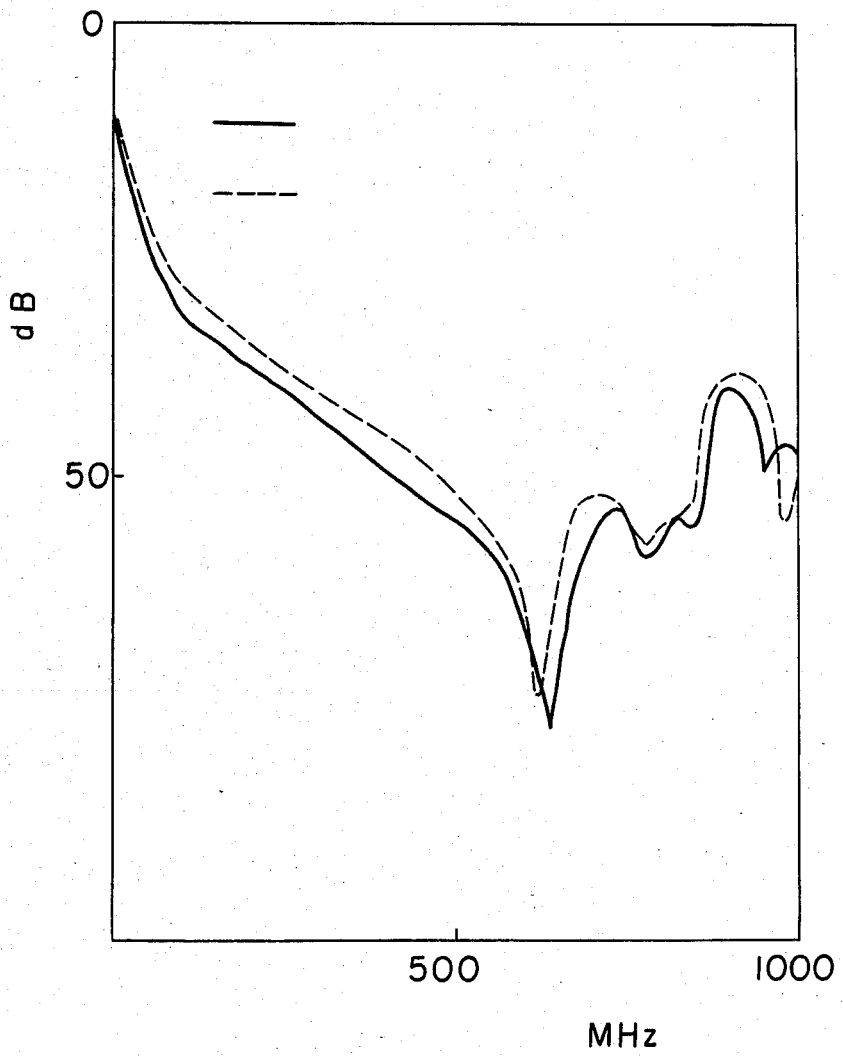
FIG. 2 is the magnetic field shielding effectiveness of the coating layer obtained in Example 5.

FIG. 2 illustrates the magnetic field shielding effectiveness, in which the ordinate axis represents the attenuation (dB), the abscissa represents the frequency (MHz), the solid line indicates the initial values, and the dotted line indicates the values after the sample was left to stand in a constant temperature and humidity chamber at 70° C. under a relative humidity of 93% for 20 days.

As is evident from these Figures, the changes in the electric field and magnetic field shielding effectiveness by the humidity test were minimum.

COMPARATIVE EXAMPLES 1 and 2

In the same manner as in Example 2, silver coated copper powders were prepared, respectively, by using the silver complex solutions as identified in Table 1.

The surface resistivity of the coating layers showed high values as compared with Examples 2 to 11, as shown in Table 1.

COMPARATIVE EXAMPLE 3

3 5 g of silver nitrate was dissolved in 60 ml of water, and 3 ml of ammonia water (concentration: 29 w/v % was added thereto.

To this solution, a solution obtained by dissolving 2.54 g of sodium hydroxide in 60 ml of water, was added, and 3.5 ml of ammonia water (concentration: 29 w/v %) was further added to obtain a colorless transparent uniform solution. This solution will be referred to as solution A.

On the other hand, a solution obtained by dissolving 22.5 g of glucose and 2 g of tartaric acid in 500 ml of water, was heated to boil for 10 minutes and then returned to room temperature. This solution will be referred to as solution B.

100 ml of water was added to 50 g of a copper powder treated in the same manner as in Example 1. While stirring the mixture, a mixture of 125 ml of solution A and 125 ml of solution B was added in 1 minute, and stirring was continued for further 1 hour to obtain a silver coated copper powder in the same manner as in Example 1. The silver content of this silver coated copper powder was 4.3% by weight.

In the same manner as in Example 1, a paint was prepared, and the surface resistivity of the coating layer was measured and found to be 0.37 Ω/☐ with a coating layer thickness of 50 μm. Namely, the electric conductivity is inferior in spite of the fact that the silver content is great as compared with the present invention.

COMPARATIVE EXAMPLE 4

(Duplication test of Japanese Examined Patent Publication No. 59283/1982)

150 ml of water was added to 40 g of a copper powder treated in the same manner as in Example 1. While stirring the mixture at 400 rpm, a solution prepared by dissolving 0.75 g of silver nitrate, 3.1 g of ammonium carbonate and 3.5 g of trisodium ethylenediamine tetraacetate in 50 ml of water, was dropwise added at room temperature over a period of 5 minutes, and the stirring was continued for further 1 hour to obtain a silver coated copper powder in the same manner as in Example 1. The silver content was 1.29% by weight.

In the same manner as in Example 1, a paint was prepared, and the surface resistivity of the coating layer was measured. The surface resistivity with a coating layer thickness of 50 μm was 0.24 Ω/☐.

In order to examine the humidity resistance, the sample was left to stand in a constant temperature and humidity chamber at 70° C. under a relative humidity of 93%. The surface resistivity of the coating layer increased by 50% upon expiration of 6 days.

COMPARATIVE EXAMPLE 5

100 ml of water was added to 50 g of a copper treated in the same manner as in Example 1. While stirring the mixture at 400 rpm, a solution prepared by dissolving 2.46 g of silver nitrate, 25 ml of ammonia water (concentration: 29 w/v %) and 35 g of sodium thiosulfate in 200 ml of water, was dropwise added at room temperature over a period of 5 minutes, and the stirring was continued for further 1 hour to obtain a silver coated copper powder in the same manner as in Example 1. The silver content was 3.0% by weight.

In the same manner as in Example 1, a paint was prepared, and the surface resistivity of the coating layer was measured. The surface resistivity with a coating layer thickness of 50 μm was 1.5 Ω/☐, thus indicating poor electric conductivity.

EXAMPLE 12

A silver coated copper powder was prepared in the same manner as in Example 1 except that a silver complex solution having the following composition was employed.

| Composition of a silver complex solution | |
|---|---|
| Silver nitrate | 40 g |
| Ammonium carbonate | 75 g |
| Ammonia water (concentration: 29 w/v %) | 150 g |
| Water | 1 liter |

The final amount of the silver coated copper powder was 394 g, and the silver content was 6.3% by weight.

This silver coated copper powder was formulated into a paint in the same manner as in Example 1, and the paint was applied onto an ABS resin plate to form a coating layer having a thickness of 50 μm. The surface resistivity of the coating layer thus obtained was 0.05 Ω/□, thus indicating excellent electric conductivity.

Further, the surface resistivity of the coating layer after the sample was left to stand in a constant temperature and humidity chamber at 70° C. under a relative humidity of 93% for 20 days, was 0.05 Ω/□, thus showing no change in the surface resistivity. Furthermore, the surface resistivity after the sample was left to stand in a constant temperature bath at 85° C. for 20 days, was 0.05 Ω/□, thus showing no change. Thus, the coating layer exhibited excellent durability.

COMPARATIVE EXAMPLE 6

A copper powder (CE1110, manufactured by Fukuda Kinzokuhaku) was subjected to degreasing treatment with an alkaline aqueous solution and oxide layer-removing treatment with diluted sulfuric acid, and then dried without contact with air. Then, a paint was prepared in the same manner as in Example 1, and coated on an ABS resin plate to form a coating layer having a thickness of 50 μm. The surface resistivity of the coating layer thus obtained was as high as 0.60 Ω/□. Further, the sample was left to stand in a constant temperature and humidity chamber at 70° C. under a relative humidity of 93%. The surface resistivity upon expiration of 3 days was as high as 3.24 Ω/□.

TABLE 1

|  | Example |  |  |  |  |  | Comparative Example |  |
|---|---|---|---|---|---|---|---|---|
|  | 2 | 3 | 4 | 5 | 6 | 7 | 1 | 2 |
| Silver nitrate (g) | 0.73 | 0.64 | 0.71 | 0.64 | 0.64 | 0.71 | 0.75 | 0.73 |
| Ammonium carbonate (g) | 25 | 15 | 5 | 5 | 5 | 5 | 20 | — |
| Ammonia water* (g) | 5 | 5 | 5 | 10 | 15 | 25 | — | 15 |
| Silver content in the silver coated copper powder (wt. %) | 1.25 | 1.10 | 1.25 | 1.06 | 1.09 | 1.23 | 1.36 | 1.29 |
| Surface resistivity Coating layer thickness of 50 μm (Ω/□) | 0.19 | 0.15 | 0.10 | 0.08 | 0.13 | 0.21 | 0.35 | 0.38 |
| Humidity resistance** | 104 | 121 | 109 | 123 | 116 | 113 | — | — |
| Heat resistance*** | 102 | 115 | 105 | 113 | 110 | 111 | — | — |

*Concentration: 29 w/v %
**The change in the surface resistivity of the coating layer after being left for 20 days in a constant temperature and humidity chamber at 70° C. under a relative humidity of 93%. The surface resistivity of the coating layer prior to the test was evaluated to be 100.
***The change in the surface resistivity of the coating layer after being left for 20 days in a constant temperature bath at 85° C. The surface resistivity of the coating layer prior to the test was evaluated to be 100.

TABLE 2

|  | Example |  |  |  |
|---|---|---|---|---|
|  | 8 Ag$_2$CO$_3$ | 9 Ag$_2$O | 10 Ag$_2$SO$_4$ | 11 AgNO$_3$ |
| Silver nitrate (g) | 0.57 | 0.48 | 0.65 | 0.60 |
| Ammonium carbonate (g) | 5 | 5 | 5 | — |
| Ammonium bicarbonate (g) | — | — | — | 8 |
| Ammonia water* (g) | 5 | 5 | 5 | 10 |
| Silver content in the silver coated copper powder (wt. %) | 1.25 | 1.14 | 1.18 | 1.02 |
| Surface resistivity Coating layer thickness of 50 μm (Ω/□) | 0.12 | 0.11 | 0.12 | 0.11 |
| Humidity resistance** | 109 | 112 | 119 | 126 |
| Heat resistance*** | 103 | 104 | 108 | 108 |

*,  and *same as in Table 1

We claim:

1. A process for producing a silver coated copper powder, comprising the steps of:
   (i) forming a silver complex solution comprising an effective amount of a silver salt, ammonium carbonate or ammonium bicarbonate, and ammonia water;
   (ii) contacting a copper powder with said silver complex solution; and
   (iii) precipitating metal silver on the surface of said copper powder to produce said silver coated copper powder,
   wherein the molar ratio of said ammonium carbonate or ammonium bicarbonate to the ammonia in said ammonia water is within a range of 0.1–3 or 0.1–6, respectively.

2. The process according to claim 1, wherein the silver salt is selected from the group consiting of silver nitrate, silver carbonate, silver sulfate and silver oxide.

3. A conductive coating composition, comprising:
   1 to 6 parts by weight of a silver coated copper powder, wherein said silver coated copper powder is produced by a process comprising the steps of:
   (i) forming a silver complex solution comprising an effective amount of a silver salt, ammonium carbonate or ammonium bicarbonate, and ammonia water;
   (ii) contacting a copper powder with said silver complex solution; and
   (iii) precipitating metal silver on the surface of said copper powder to produce said silver coated copper powder,
   wherein the molar ratio of said ammonium carbonate or ammonium bicarbonate to the ammonia in said ammonia water is within a range of 0.1–3 or 0.1–6, respectively, and
   1 part by weight of a binder.

4. The conductive coating composition according to claim 3, which further contains an anti-settling additive in an amount of from 0.5 to 5% by weight relative to the silver coated copper powder.

* * * * *